US008525541B2

(12) United States Patent
Lan et al.

(10) Patent No.: US 8,525,541 B2
(45) Date of Patent: Sep. 3, 2013

(54) TEST METHOD OF LIQUID CRYSTAL DISPLAY PANEL

(75) Inventors: Wei-Ting Lan, Tainan County (TW); Cheng-Chi Yen, Tainan County (TW); Ju-Tien Cheng, Tainan County (TW)

(73) Assignee: Himax Display, Inc., Tainan (TW)

(*) Notice: Subject to any disclaimer, the term of this patent is extended or adjusted under 35 U.S.C. 154(b) by 383 days.

(21) Appl. No.: 12/878,241

(22) Filed: Sep. 9, 2010

(65) Prior Publication Data

US 2012/0062263 A1 Mar. 15, 2012

(51) Int. Cl.
*G01R 31/26* (2006.01)

(52) U.S. Cl.
USPC .......... 324/760.01

(58) Field of Classification Search
USPC .......... 324/760.01–760.02, 762.01–762.1, 324/754.01–754.3; 257/48; 438/14–18
See application file for complete search history.

(56) References Cited

U.S. PATENT DOCUMENTS

| | | | | |
|---|---|---|---|---|
| 5,377,030 | A * | 12/1994 | Suzuki et al. | 349/187 |
| 7,012,445 | B2 * | 3/2006 | Itagaki | 324/760.02 |
| 2006/0125510 | A1 | 6/2006 | Brunner et al. | |

FOREIGN PATENT DOCUMENTS

| | | |
|---|---|---|
| TW | 200426747 | 12/2004 |
| TW | I233082 | 5/2005 |
| TW | 200807120 | 2/2008 |
| TW | 200935125 | 8/2009 |

OTHER PUBLICATIONS

“Office Action of Taiwan Counterpart Application”, issued on Feb. 26, 2013, p. 1-p. 5, in which the listed references were cited.

* cited by examiner

*Primary Examiner* — Tung X Nguyen
(74) *Attorney, Agent, or Firm* — J.C. Patents

(57) ABSTRACT

A test method of a liquid crystal display panel is provided. The liquid crystal display panel includes a plurality of pixels and a testing pad. The pixels are disposed at intersections between a first, a second, and a third data lines and a plurality of scan lines. In the test method, each of the scan lines is driven to connect liquid crystal capacitors of the pixels to the first, the second, and the third data lines. A first and a second test voltages are respectively supplied to the first and the second data lines, wherein the first test voltage is not equal to the second test voltage. The first data line is floated. The floated first data line is measured through the testing pad to determine whether the liquid crystal capacitors of the pixels electrically connected to the first and the second data lines are electrically connected with each other.

11 Claims, 7 Drawing Sheets

TEST METHOD OF LIQUID CRYSTAL DISPLAY PANEL

BACKGROUND OF THE INVENTION

1. Field of the Invention

The present invention generally relates to a test method, and more particularly, to a test method of a liquid crystal display panel.

2. Description of Related Art

A liquid crystal on silicon (LCOS) panel is a liquid crystal panel constructed on a silicon wafer. LCOS panel has been broadly applied to different types of liquid crystal projectors thanks to its small volume and high resolution.

In a LCOS panel, MOS transistors are disposed for replacing the thin film transistors (TFTs) in a conventional liquid crystal display (LCD), and pixel electrodes are mainly made of metal materials. Thus, a LCOS panel is a reflective liquid crystal panel. As to a reflective liquid crystal panel, a higher reflectivity results in a higher light efficiency. Thus, pixels of a LCOS panel should be closely arranged to achieve a higher reflectivity of the LCOS panel.

However, short circuit between pixel electrodes may be produced if the pixels are arranged close to each other. Because any abnormity on a LCOS panel is usually detected through a lit image after the LCOS panel is assembled, the fabrication time of the LCOS panel is prolonged and the fabrication cost thereof is increased. Thereby, how to detect short circuit between pixel electrodes right after a silicon wafer is manufactured has become one of the major subjects in the testing of LCOS panels.

SUMMARY OF THE INVENTION

Accordingly, the present invention is directed to a test method adaptable to a liquid crystal display panel, wherein the liquid crystal display panel has a color filter, and the test method can reduce the fabrication cost The present invention is also directed to a test method adaptable to a liquid crystal display panel, wherein the liquid crystal display panel adopts a color sequential technique, and the test method can reduce the fabrication time of the display panel.

The present invention is further directed to a test method adaptable to a liquid crystal display panel, wherein the liquid crystal display panel adopts a color sequential technique, and the test method can detect any wrong connection of liquid crystal capacitors right after a silicon wafer is manufactured.

The present invention provides a test method of a liquid crystal display panel. The liquid crystal display panel includes a plurality of pixels and a testing pad. The pixels are disposed at intersections between a first data line, a second data line, and a third data line and a plurality of scan lines. The test method includes following steps. Each of the scan lines is driven to connect liquid crystal capacitors of the pixels to the first data line, the second data line, and the third data line. A first test voltage and a second test voltage are respectively supplied to the first data line and the second data line, wherein the first test voltage is not equal to the second test voltage. The first data line is floated. The floated first data line is measured through the testing pad to determine whether the liquid crystal capacitors of the pixels electrically connected to the first data line and the second data line are electrically connected with each other.

According to an embodiment of the present invention, the test method further includes following steps. The first test voltage is supplied to the third data line. The third data line is floated. The floated third data line is measured through the testing pad to determine whether the liquid crystal capacitors of the pixels electrically connected to the third data line and the second data line are electrically connected with each other.

The present invention provides a test method of a liquid crystal display panel. The liquid crystal display panel includes a plurality of pixels and a plurality of testing pads. Each of the pixels includes a precharged capacitor, a buffer, and a liquid crystal capacitor. The pixels are electrically connected to a scan line, a display line, and a plurality of data lines. The test method includes following steps. The buffer of each of the pixels is disabled. The scan line and the display line are driven to connect the liquid crystal capacitors and the precharged capacitors of the pixels to the data lines. A first test voltage is sent to odd data lines among the data lines, and a second test voltage is set to even data lines among the data lines, wherein the second test voltage is not equal to the first test voltage. The odd data lines or the even data lines are floated. The floated odd data lines or even data lines are measured through a part of the testing pads to determine whether the liquid crystal capacitors of the pixels are electrically connected with each other.

The present invention provides a test method of a liquid crystal display panel. The liquid crystal display panel includes M pixels and a testing pad, each of the pixels includes a precharged capacitor, a buffer, and a liquid crystal capacitor, and the pixels are electrically connected to M scan lines, M display lines, and a data line, wherein M is an integer greater than or equal to 2. The test method includes following steps. The buffer of each of the pixels is disabled. The liquid crystal capacitor and the precharged capacitor of the $j^{th}$ pixel are charged to a first test voltage, wherein j is a positive integer smaller than M. The liquid crystal capacitor and the precharged capacitor of the $(j+1)^{th}$ pixel are charged to a second test voltage, wherein the first test voltage is not equal to the second test voltage. While the $(j+1)^{th}$ scan line and the $(j+1)^{th}$ display line are driven, the buffer of the $j^{th}$ pixel is enabled, and the data line is floated. While the $(j+1)^{th}$ scan line and the $(j+1)^{th}$ display line are driven, the floated data line is measured through the testing pad to determine whether the liquid crystal capacitors of the $j^{th}$ pixel and the $(j+1)^{th}$ pixel are electrically connected with each other.

As described above, in the present invention, pixels are respectively charged to different test voltages, and some of the data lines are switched to a floating state. Measurement voltages are obtained by measuring the floated data lines, and whether liquid crystal capacitors of the pixels are wrongly connected due to short circuit between pixel electrodes is determined according to the measurement voltages. In addition, the test method provided by the present invention can detect any incorrect connection of the liquid crystal capacitors before a display panel is assembled, so that both the fabrication time and the fabrication cost of the display panel are reduced.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
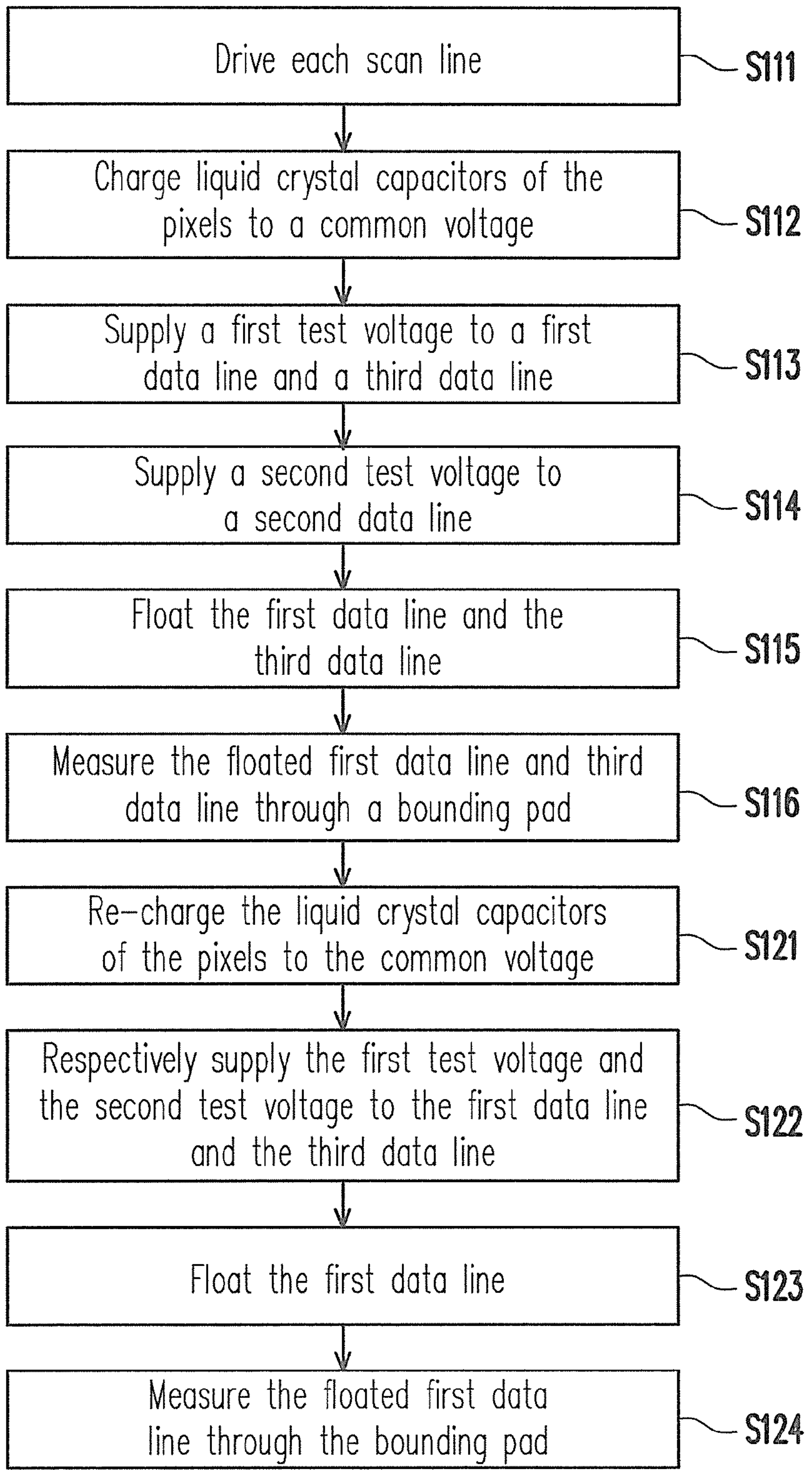
FIG. 1 is a flowchart of a test method of a liquid crystal display panel according to an embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1 is a flowchart of a test method of a liquid crystal display panel according to an embodiment of the present invention. Wherein, the liquid crystal display panel is, for example, a liquid crystal on silicon (LCOS) panel having a color filter. Herein, the structure of the LCOS panel having the color filter will be described before the embodiment illustrated in FIG. 1 is described.

Figure 2:
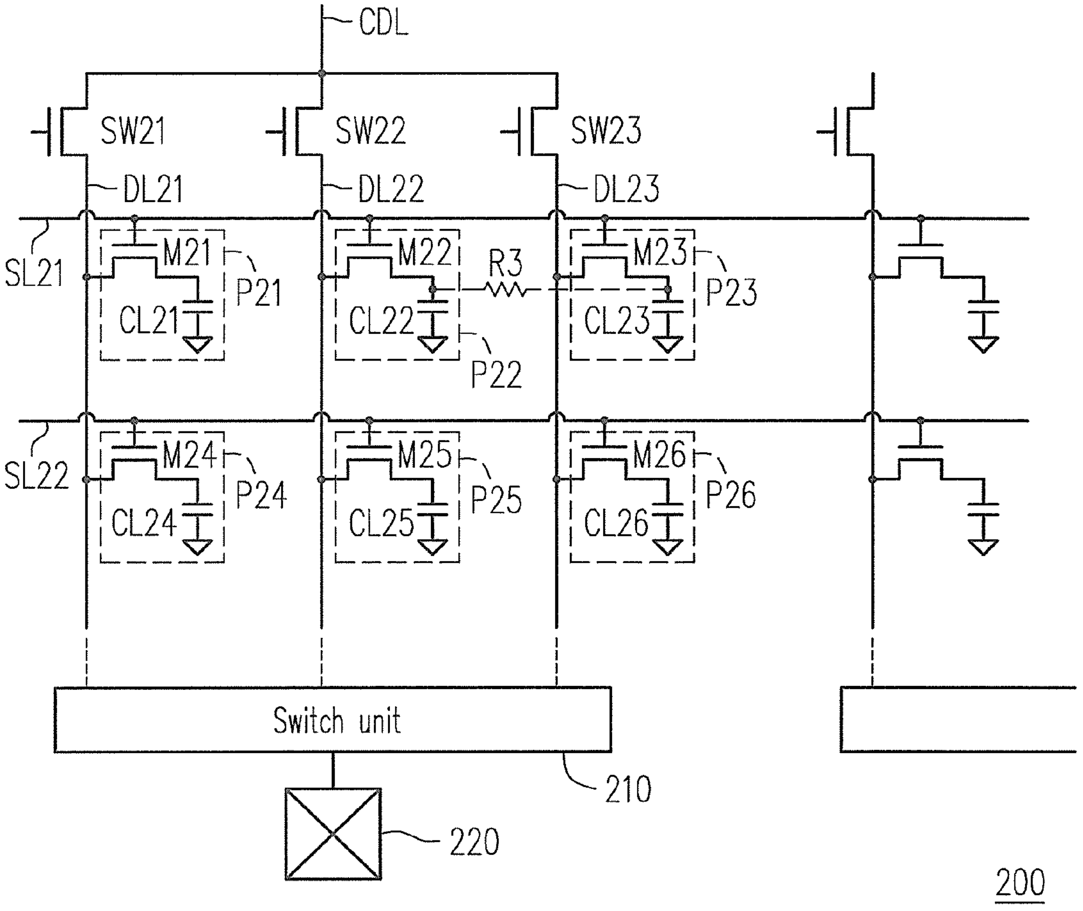
FIG. 2 is a schematic diagram of a LCOS panel having a color filter according to an embodiment of the present invention.

FIG. 2 is a schematic diagram of the LCOS panel having the color filter according to an embodiment of the present invention. Referring to FIG. 2, the LCOS panel 200 includes a plurality of pixels P21-P26, a plurality of switches SW21-SW23, a switch unit 210, and a testing pad 220. A color filter (not shown) is respectively disposed above each of the pixels P21-P26. For example, the pixels P21-P23 are respectively corresponding to a red, a green, and a blue color filters. Besides, the pixels P21-P26 are disposed at intersections between a first data line DL21, a second data line DL22, and a third data line DL23 and a plurality of scan lines SL21-SL22. The switches SW21-SW23 are electrically connected to the first data line DL21, the second data line DL22, and the third data line DL23. Thus, the on/off states of the switches SW21-SW23 determine whether the first data line DL21, the second data line DL22, and the third data line DL23 are floated. The switch unit 210 connects one of the first data line DL21, the second data line DL22, and the third data line DL23 to the testing pad 220 to measure the pixels P21-P26.

Figure 3:
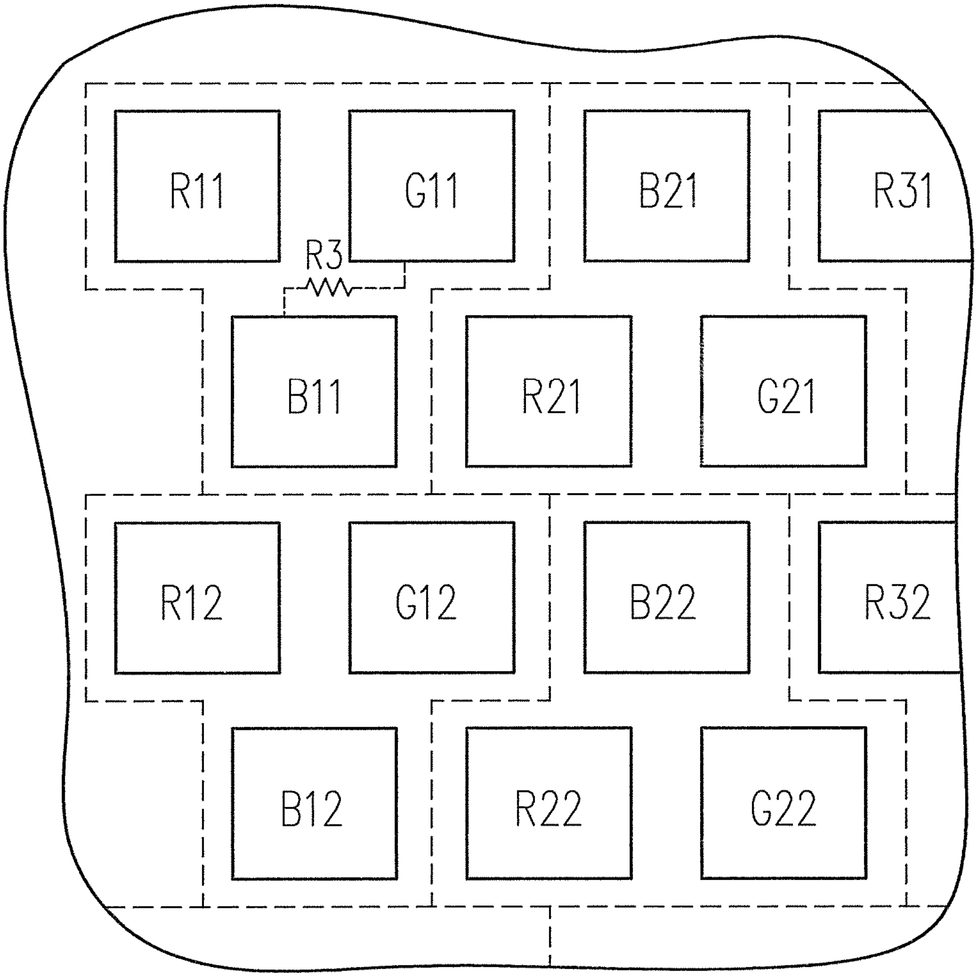
FIG. 3 is a diagram illustrating the layout of upper electrodes of liquid crystal capacitors in FIG. 2.

Each of the pixels P21-P26 includes a liquid crystal capacitor and a pixel switch. For example, the pixel P21 includes a liquid crystal capacitor CL21 and a pixel switch M21. Regarding the actual layout, the upper electrodes of the liquid crystal capacitors CL21-CL26 are all disposed on the same circuit layer. FIG. 3 is a diagram illustrating the layout of upper electrodes of the liquid crystal capacitors in FIG. 2. Referring to FIG. 3, the metal electrodes R11, G11, and B11 are respectively the upper electrodes of the liquid crystal capacitors CL21-CL23, and the metal electrodes R12, G12, and B12 are respectively the upper electrodes of the liquid crystal capacitors CL24-CL26. Besides, along with the reduction in the space between the pixels P21-P26, two adjacent metal electrodes may be connected with each other. For example, the incorrect connection caused by short-circuited pixel electrodes may form a parasitic resistor R3 between the metal electrodes G11 and B11 such that the metal electrodes G11 and B11 are electrically connected with each other.

In order to immediately detect short-circuited pixel electrodes (i.e., incorrect connections of liquid crystal capacitors) when a silicon wafer leaves the factory, how the LCOS panel 200 illustrated in FIG. 2 is tested will be explained with reference to the flowchart illustrated in FIG. 1. Referring to both FIG. 1 and FIG. 2, in step S111, each scan line is driven. For example, a high voltage is supplied to the scan lines SL21-SL22 to turn on the pixel switches M21-M26 of the pixels P21-P26. Accordingly, the liquid crystal capacitors CL21-CL26 of the pixels P21-P26 are respectively electrically connected to the corresponding data lines.

Then, in step S112, the liquid crystal capacitors CL21-CL26 of the pixels P21-P26 are charged to a common voltage. For example, the common voltage is transmitted through a common line CDL and is simultaneously or sequentially received by the first data line DL21, the second data line DL22, and the third data line DL23 when the switches SW21-SW23 are simultaneously or sequentially turned on. As a result, the liquid crystal capacitors CL21-CL26 of the pixels P21-P26 are set to the common voltage. Next, in steps S113 and S114, a first test voltage is supplied to the first data line and the third data line, and a second test voltage is supplied to the second data line, wherein the first test voltage is not equal to the second test voltage.

For example, a panel driver (not shown) sequentially outputs the first test voltage (for example, 5V), the second test voltage (for example, 10V), and the first test voltage (for example, 5V) to the common line CDL according to a test pattern (for example, FF/00/FF). Thus, along with the switches SW21-SW23 being sequentially turned on, the liquid crystal capacitor CL21 electrically connected to the first data line DL21 are charged to the first test voltage (for example, 5V), the liquid crystal capacitor CL22 electrically connected to the second data line DL22 are charged to the second test voltage (for example, 10V), and the liquid crystal capacitor CL23 electrically connected to the third data line DL23 are charged to the first test voltage (for example, 5V).

Thereafter, in steps S115 and S116, the first data line and the third data line are floated, and the floated first data line and third data line are measured through the testing pad, so as to determine whether the liquid crystal capacitors of the pixels are electrically connected with each other. For example, the switches SW21 and SW23 are not turned on so that the first data line DL21 and the third data line DL23 are kept in the floating state. When the metal electrodes G11 and B11 are wrongly connected (as shown in FIG. 3), the liquid crystal capacitor CL22 is electrically connected to the liquid crystal capacitor CL23 through the parasitic resistor R3. Since the liquid crystal capacitor CL22 in the second column and the liquid crystal capacitor CL23 in the third column have different voltage levels, the voltage levels on the liquid crystal capacitors CL22 and CL23 change due to a charge sharing effect.

On the other hand, when the switch unit 210 electrically connects the testing pad 220 to the floated third data line DL23, a measurement voltage is obtained. Whether the liquid crystal capacitor CL22 in the second column and the liquid crystal capacitor CL23 in the third column are electrically connected with each other is then determined by comparing the measurement voltage with the first test voltage. When the measurement voltage is not equal to the first test voltage (i.e., the voltage levels of the liquid crystal capacitor CL22 and/or the liquid crystal capacitor CL23 change), it is determined that the liquid crystal capacitor CL22 in the second column and the liquid crystal capacitor CL23 in the third column are electrically connected with each other. Contrarily, when the measurement voltage is equal to the first test voltage (i.e., the voltage levels of the liquid crystal capacitors CL22 and CL23 do not change), it is determined that the liquid crystal capacitor CL22 in the second column and the liquid crystal capacitor CL23 in the third column are not electrically connected with each other.

Similarly, the testing pad 220 is further electrically connected to the floated first data line DL21 through the switching of the switch unit 210 so that another measurement voltage is obtained. Herein since the liquid crystal capacitor CL21 in the first column and the liquid crystal capacitor CL22 in the second column have different voltage levels, whether the liquid crystal capacitor CL21 in the first column and the liquid crystal capacitor CL22 in the second column are electrically connected with each other can be further determined by comparing this another measurement voltage with the first test voltage. Herein the liquid crystal capacitor CL21 in the first column is the liquid crystal capacitor electrically connected to the first data line DL21, and the correspondences between other liquid crystal capacitors and data lines can be understood accordingly.

To be more specific, as shown in FIG. 3, incorrect connections of the metal electrodes include the connection between R11 and G11, the connection between G11 and B11, and the connection between R11 and B11 based on the arrangement of the metal electrodes. Namely, the incorrect connections of the liquid crystal capacitors include the incorrect connection between the liquid crystal capacitors in the first column and the second column, the incorrect connection between the liquid crystal capacitors in the second column and the third column, and the incorrect connection between the liquid crystal capacitors in the first column and the third column. In steps S111-S116, the incorrect connection between the liquid crystal capacitors in the first column and the second column and the incorrect connection between the liquid crystal capacitors in the second column and the third column have been detected. Thus, how the incorrect connection between the liquid crystal capacitors in the first column and the third column is detected in steps S121-S124 will be described below.

Referring to FIG. 1 and FIG. 2 again, in step S121, when another incorrect connection is tested, the liquid crystal capacitors CL21-CL26 of the pixels P21-P26 are re-charged to the common voltage. For example, the common voltage is transmitted again through the common line CDL, and the liquid crystal capacitors CL21-CL26 of the pixels P21-P26 are reset to the common voltage through the switching of the switches SW21-SW23. Next, in step S122, the first test voltage and the second test voltage are respectively supplied to the third data line and the first data line.

For example, the panel driver (not shown) sequentially outputs the first test voltage (for example, 5V), the first test voltage (for example, 5V), and the second test voltage (for example, 10V) to the common line CDL according to another test pattern (for example, FF/FF/00). Along with the switches SW21-SW23 being sequentially turned on, the liquid crystal capacitors CL21 and CL22 electrically connected to the first data line DL21 and the second data line DL22 are charged to the first test voltage (for example, 5V), and the liquid crystal capacitor CL23 electrically connected to the third data line DL23 are charged to the second test voltage (for example, 10V).

After that, in steps S123 and S124, the first data line is floated, and the floated first data line is measured through the testing pad, so as to determine whether the liquid crystal capacitors in the first column and the third column are electrically connected with each other. For example, the testing pad 220 is electrically connected to the floated first data line DL21 through the switching of the switch unit 210 so that another measurement voltage is obtained. Since the liquid crystal capacitor CL21 in the first column and the liquid crystal capacitor CL23 in the third column have different voltage levels, whether the liquid crystal capacitor CL21 in the first column and the liquid crystal capacitor CL23 in the third column are electrically connected with each other is determined by comparing this another measurement voltage with the first test voltage.

Figure 4:
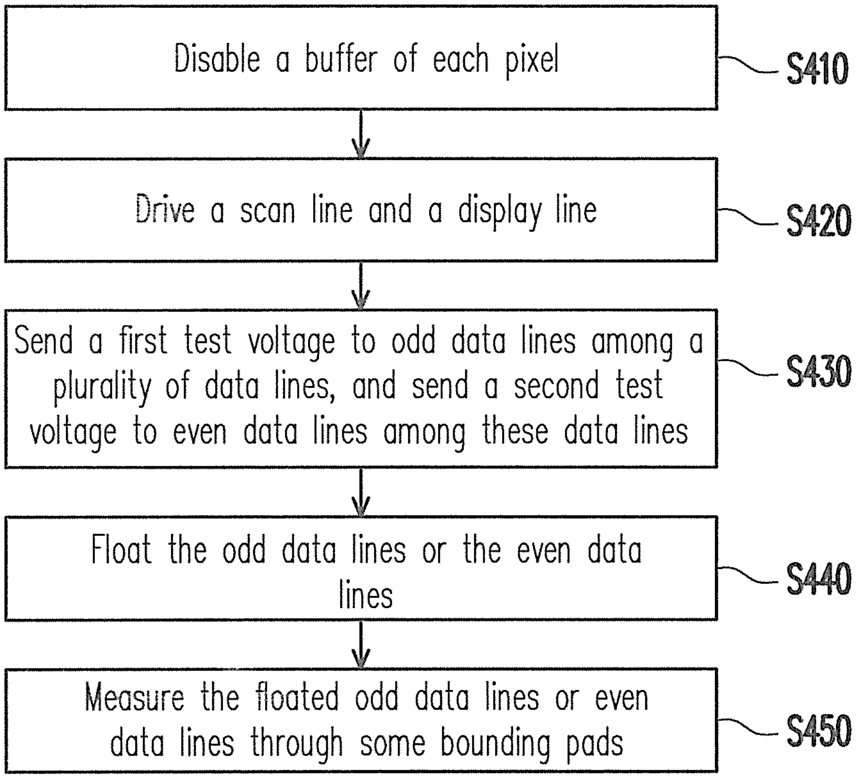
FIG. 4 is a flowchart of a test method of a liquid crystal display panel according to another embodiment of the present invention.

FIG. 4 is a flowchart of a test method of a liquid crystal display panel according to another embodiment of the present invention. Wherein, the liquid crystal display panel is, for example, a LCOS panel adopting a color sequential technique. Namely, light emitting diodes (LEDs) are disposed as the backlight source of the liquid crystal display panel. Thereby, the structure of the LCOS panel adopting the color sequential technique will be explained herein before the embodiment illustrated in FIG. 4 is described.

Figure 5:
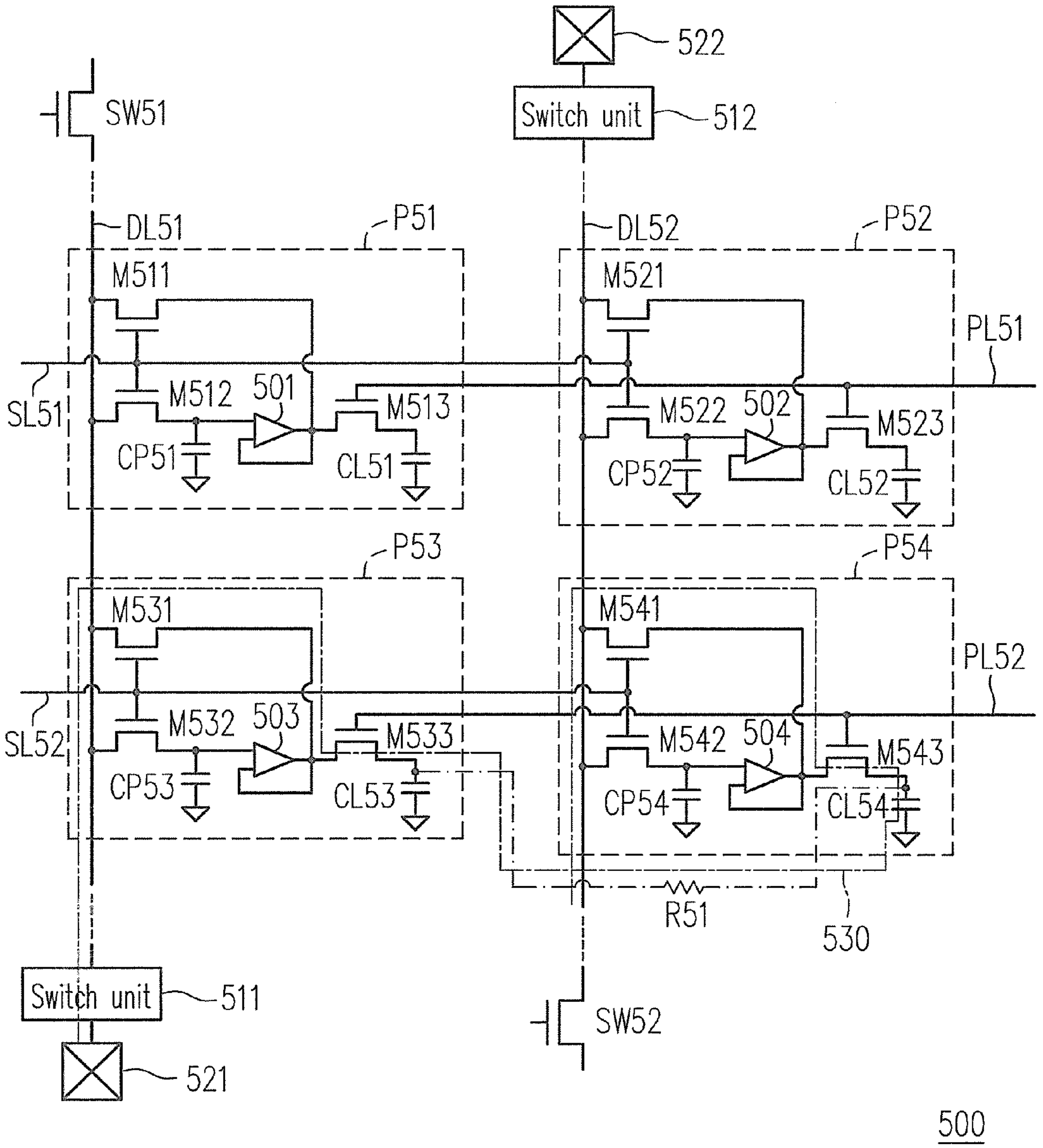
FIG. 5 is a schematic diagram of a LCOS panel adopting a color sequential technique according to an embodiment of the present invention.

FIG. 5 is a schematic diagram of a LCOS panel adopting a color sequential technique according to an embodiment of the present invention. Referring to FIG. 5, the LCOS panel 500 includes a plurality of pixels P51-P54, a plurality of switches SW51-SW52, a plurality of switch units 511-512, and a plurality of testing pads 521-522. A precharge mechanism is adopted by the pixels P51-P54. Accordingly, each pixel includes a precharged capacitor, a liquid crystal capacitor, a buffer, and two pixel switches. For example, the pixel P51 includes a precharged capacitor CP51, a liquid crystal capacitor CL51, a buffer 501, and two pixel switches M512 and M513. Besides, in order to respectively control the two pixel switches in the precharge mechanism, each pixel is electrically connected to a scan line, a display line, and a data line. For example, the pixel P51 is electrically connected to the scan line SL51, the display line PL51, and the data line DL51.

In addition, in order to directly measure the voltage variation on the liquid crystal capacitor when a pixel is tested, each pixel further includes a pixel switch electrically connected between the data line and the output terminal of the buffer. For example, besides the pixel switches M512 and M513, the pixel P51 further includes another pixel switch M511, wherein the pixel switch M511 is electrically connected between the data line DL51 and the output terminal of the buffer 501. Moreover, in order to test the pixels, one end of each data line is electrically connected to a switch, and the other end thereof is electrically connected to a testing pad through a switch unit. For example, one end of the data line DL51 is electrically connected to the switch SW51, and the other end thereof is electrically connected to the testing pad 521 through the switch unit 511.

Figure 6:
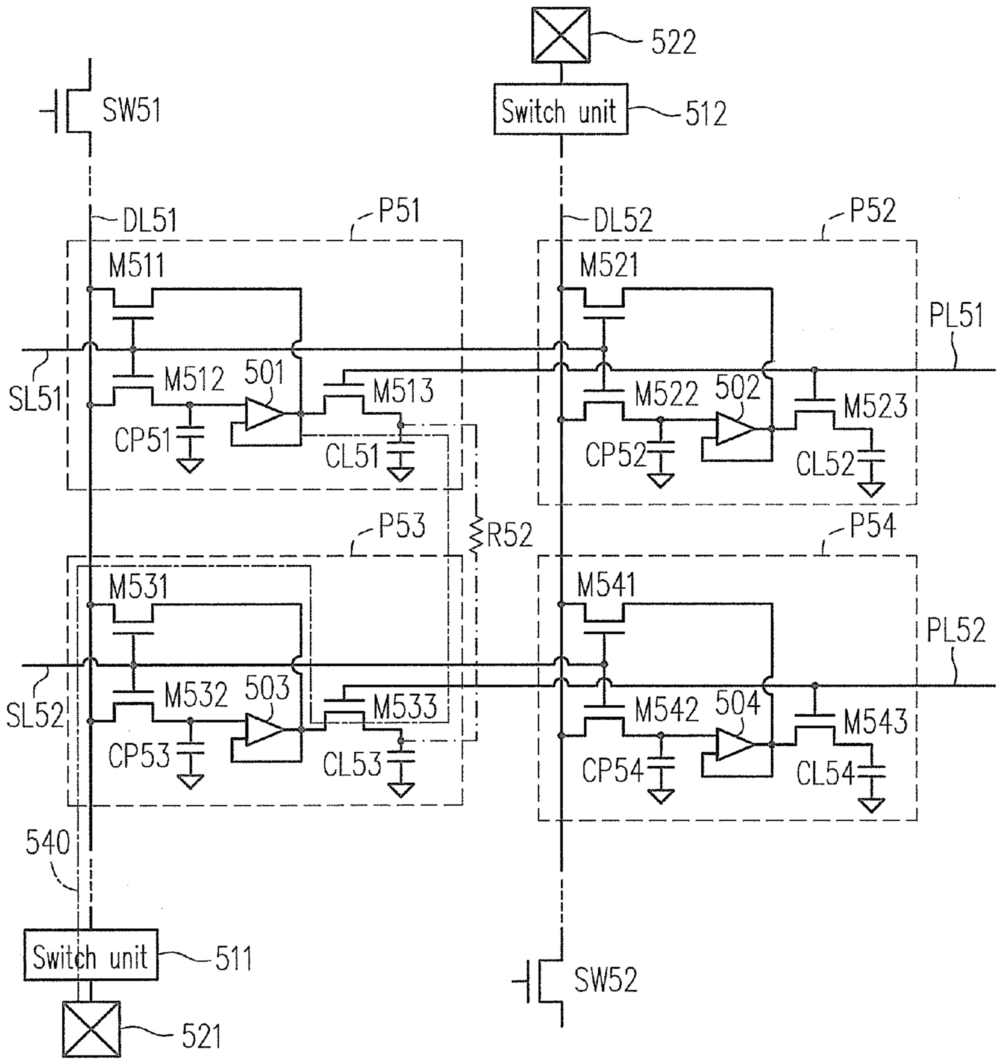
FIG. 6 is a schematic diagram of a LCOS panel adopting a color sequential technique according to another embodiment of the present invention.

Regarding the actual layout, the upper electrodes of the liquid crystal capacitors CL51-CL54 are all disposed on the same circuit layer and are arranged in a grid shape. Thus, the incorrect connections of the liquid crystal capacitors may be connections between the liquid crystal capacitors of horizontally adjacent pixels (i.e., adjacent pixels arranged from left to right) and connections between liquid crystal capacitors of vertically adjacent pixels (i.e., adjacent pixels arranged from top to bottom). For example, as shown in FIG. 5, the incorrect connection caused by short-circuited pixel electrodes may form a parasitic resistor R51 between the liquid crystal capacitor CL53 and the liquid crystal capacitor CL54, such that the liquid crystal capacitors CL53 and CL54 of the two horizontally adjacent pixels P53 and P54 are wrongly connected. FIG. 6 is a schematic diagram of a LCOS panel adopting a color sequential technique according to another embodiment of the present invention. As shown in FIG. 6, the incorrect connection caused by short-circuited pixel electrodes may also form a parasitic resistor R52 between the liquid crystal capacitor CL51 and the liquid crystal capacitor CL53, such that the liquid crystal capacitors CL51 and CL53 of the two vertically adjacent pixels P51 and P53 are wrongly connected.

Below, how the liquid crystal capacitors of two horizontally adjacent pixels are tested will be explained with reference to both FIG. 4 and FIG. 5. In step S410, while testing incorrect connections of liquid crystal capacitors, the buffer of each pixel is disabled. For example, the buffers 501-504 of the pixels P51-P54 are not activated. In step S420, the scan lines and the display lines are driven. For example, a high voltage is supplied to the scan lines SL51-SL52 and the display lines PL1-PL52 to turn on each pixel switch in the pixels P51-P54. Accordingly, the liquid crystal capacitors CL51-CL54 and the precharged capacitors CP51-CP54 of the pixels P51-P54 are respectively electrically connected to the corresponding data lines.

Next, in step S430, a first test voltage is transmitted to odd data lines among a plurality of data lines, and a second test voltage is transmitted to even data lines among the data lines, wherein the second test voltage is not equal to the first test voltage. For example, the switches SW51 and SW52 are turned on so that the panel driver (not shown) respectively transmits the first test voltage (for example, 0V) and the second test voltage (for example, 6V) to the data lines DL51 and DL52. Accordingly, the liquid crystal capacitor CL53 electrically connected to the data line DL51 are charged to the first test voltage (for example, 0V), and the liquid crystal capacitor CL54 electrically connected to the data line DL52 are charged to the second test voltage (for example, 6V).

After that, in steps S440 and S450, the odd data lines or the even data lines are floated, and the floated odd data lines or even data lines are measured through some of the testing pads, so as to determine whether the liquid crystal capacitors of the horizontally adjacent pixels are electrically connected with each other. For example, if the data line DL51 is kept in the floating state, the testing pad 521 is electrically connected to the floated data line DL51 through the switching of the switch unit 511, and a measurement voltage is obtained.

Since the liquid crystal capacitor CL53 in the first column and the liquid crystal capacitor CL54 in the second column have different voltage levels, when the parasitic resistor R51 is formed due to short-circuited pixel electrodes, the charge sharing between the liquid crystal capacitors CL53 and CL54 is caused through the parasitic resistor R51 (as indicated by the current path 530). As a result, the voltage level on the liquid crystal capacitor CL53 changes. Accordingly, when the data line DL51 is kept in the floating state, whether the liquid crystal capacitors of horizontally adjacent pixels are electrically connected with each other can be determined by comparing the measurement voltage with the first test voltage.

When the measurement voltage is not equal to the first test voltage, it is determined that the liquid crystal capacitor CL53 in the first column and the liquid crystal capacitor CL54 in the second column are electrically connected with each other. Contrarily, when the measurement voltage is equal to the first test voltage, it is determined that the liquid crystal capacitor CL53 in the first column and the liquid crystal capacitor CL54 in the second column are not electrically connected with each other. On the other hand, when the data line DL52 is kept in the floating state, a measurement voltage is obtained by measuring the floated data line DL52 and whether the liquid crystal capacitors of horizontally adjacent pixels are electrically connected with each other can be determined by comparing the measurement voltage with the second test voltage.

Figure 7:
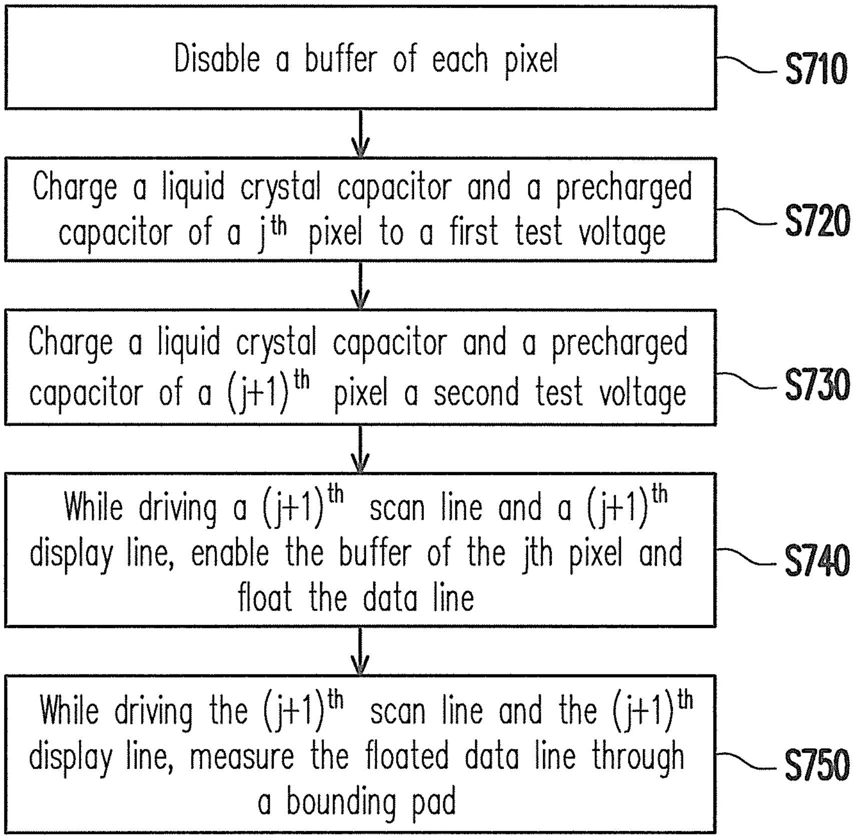
FIG. 7 is a flowchart of a test method of a liquid crystal display panel according to another embodiment of the present invention.

FIG. 7 is a flowchart of a test method of a liquid crystal display panel according to another embodiment of the present invention. Wherein, the liquid crystal display panel is, for example, a LCOS panel adopting a color sequential technique, and the test method illustrated in FIG. 7 is used to detect any incorrect connection between liquid crystal capacitors of vertically adjacent pixels. Below, how incorrect connection between liquid crystal capacitors of vertically adjacent pixels is detected will be explained with reference to both FIG. 6 and FIG. 7, and M pixels P51 and P53 electrically connected to the data line DL51 will be taken as examples, wherein M is 2.

In S710, while detecting any incorrect connection of liquid crystal capacitors, the buffer of each pixel is disabled. For example, at the beginning of the test, the buffers 501-504 of the pixels P51-P54 are not activated. In step S720, the liquid crystal capacitor and the precharged capacitor of the $j^{th}$ pixel are charged to a first test voltage, wherein j is a positive integer smaller than M.

Taking the first pixel P51 as an example, a high voltage is supplied to the scan line SL51 and the display line PL1 to turn on the pixel switches M511-M513 of the pixel P51. Besides, the switch SW51 is turned on so that the panel driver (not shown) transmits the first test voltage (for example, 6V) to the data line DL51. The pixel switches M511-M513 then transmit the first test voltage (for example, 6V) to the liquid crystal capacitor CL51 and the precharged capacitor CP51, so as to charge the liquid crystal capacitor CL51 and the precharged capacitor CP51 to the first test voltage (for example, 6V). In other words, the detailed procedure of step S720 includes driving the $j^{th}$ scan line and the $j^{th}$ display line and transmitting the first test voltage to the data line.

Next, in step S730, the liquid crystal capacitor and the precharged capacitor of the $(j+1)^{th}$ pixel are charged to the second test voltage, wherein the first test voltage is not equal to the second test voltage.

For example, the next pixel P53 is charged after the first pixel P51 is charged. Herein the scan line SL52 and the display line PL52 are driven, while other scan lines or display lines are not driven. Accordingly, the pixel switches M531-M533 of the pixel P53 are turned on. Besides, the panel driver transmits the second test voltage (for example, 0V) to the data line DL51 through the switch SW51 that is turned on. After that, the second test voltage (for example, 0V) from the data line DL51 is sent to the liquid crystal capacitor CL53 and the precharged capacitor CP53 to charge the liquid crystal capacitor CL53 and the precharged capacitor CP53 to the second test voltage (for example, 0V). In other words, the detailed procedure of step S730 includes driving the $(j+1)^{th}$ scan line and the $(j+1)^{th}$ display line and transmitting the second test voltage to the data line.

Thereafter, in step S740, while driving the $(j+1)^{th}$ scan line and the $(j+1)^{th}$ display line, the buffer of the $j^{th}$ pixel is enabled, and the data line is floated. For example, while driving the scan line SL52 and the display line PL52, the buffer 501 of the previous pixel P51 is enabled, and the data line DL51 is switched to a floating state by turning off the switch SW51. Namely, while driving the scan line SL52 and the display line PL52, the pixel P53 is charged, and after that, the buffer 501 of the previous pixel P51 is driven, and the data line DL51 is floated.

Next, in step S750, while driving the $(j+1)^{th}$ scan line and the $(j+1)^{th}$ display line, the floated data line is measured through the testing pad, so as to determine whether the liquid crystal capacitors of the $j^{th}$ pixel and the $(j+1)^{th}$ pixel are electrically connected with each other. For example, the testing pad 521 is electrically connected to the floated data line DL51 through the switching of the switch unit 511, so as to obtain a measurement voltage. Since the liquid crystal capacitor CL51 in the first column and the liquid crystal capacitor CL53 in the second column have different voltage levels, as shown in FIG. 6, when the parasitic resistor R52 is formed due to short-circuited pixel electrodes, the driven buffer 501 causes the charge sharing between the liquid crystal capacitors CL51 and CL53 through the parasitic resistor R52 (as indicated by the current path 540). As a result, the voltage level on the liquid crystal capacitor CL53 changes. Accordingly, whether the liquid crystal capacitors of the vertically adjacent pixels are electrically connected with each other can be determined by comparing the measurement voltage with the second test voltage.

When the measurement voltage is not equal to the second test voltage (i.e., the voltage level on the liquid crystal capacitor CL53 changes), it is determined that the liquid crystal capacitor CL51 in the first column and the liquid crystal capacitor CL53 in the second column are electrically connected with each other. Contrarily, when the measurement voltage is not equal to the second test voltage (i.e., the voltage level on the liquid crystal capacitor CL53 does not change), it is determined that the liquid crystal capacitor CL51 in the first column and the liquid crystal capacitor CL53 in the second column are not electrically connected with each other.

In summary, in the present invention, pixels are respectively charged to different test voltages, and some of the data lines are switched to a floating state. Measurement voltages are obtained by measuring the floated data lines, and whether liquid crystal capacitors of the pixels are wrongly connected due to short circuit between pixel electrodes is determined according to the measurement voltages. In addition, the test method provided by the present invention can detect any incorrect connection of the liquid crystal capacitors right when a silicon wafer leaves the factory. Thus, both the fabrication time and the fabrication cost of a display panel are reduced.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A test method of a liquid crystal display panel, wherein the liquid crystal display panel comprises a plurality of pixels and a testing pad, and the pixels are disposed at intersections between a first data line, a second data line, and a third data line and a plurality of scan lines, the test method comprising:

driving the scan lines to connect liquid crystal capacitors of the pixels to the first data line, the second data line, and the third data line;

respectively supplying a first test voltage and a second test voltage to the first data line and the second data line, wherein the first test voltage is not equal to the second test voltage;

floating the first data line; and measuring the floated first data line through the testing pad to obtain a measurement voltage and comparing the measurement voltage with the first test voltage to determine whether the liquid crystal capacitors of the pixels electrically connected to the first data line and the second data line are electrically connected with each other.

2. The test method according to claim 1 further comprising:

supplying the first test voltage to the third data line;

floating the third data line; and measuring the floated third data line through the testing pad to determine whether the liquid crystal capacitors of the pixels electrically connected to the third data line and the second data line are electrically connected with each other.

3. The test method according to claim 1 further comprising:

charging the liquid crystal capacitors of the pixels to a common voltage.

4. The test method according to claim 3 further comprising:

re-charging the liquid crystal capacitors of the pixels to the common voltage;

respectively supplying the first test voltage and the second test voltage to the first data line and the third data line;

floating the first data line; and measuring the floated first data line through the testing pad to determine whether the liquid crystal capacitors of the pixels electrically connected to the first data line and the third data line are electrically connected with each other.

5. The test method according to claim 1, wherein the step of measuring the floated first data line through the testing pad to obtain the measurement voltage and comparing the measurement voltage with the first test voltage to determine whether the liquid crystal capacitors of the pixels electrically connected to the first data line and the third data line are electrically connected with each other comprises:

electrically connecting the testing pad to the floated first data line;

determining whether the measurement voltage is equal to the first test voltage according to a comparison result of comparing the measurement voltage with the first test voltage;

when the measurement voltage is not equal to the first test voltage, determining that the liquid crystal capacitors of the pixels electrically connected to the first data line and the second data line are electrically connected with each other; and when the measurement voltage is equal to the first test voltage, determining that the liquid crystal capacitors of the pixels electrically connected to the first data line and the second data line are not electrically connected with each other.

6. A test method of a liquid crystal display panel, wherein the liquid crystal display panel comprises a plurality of pixels and a plurality of testing pads, each of the pixels comprises a precharged capacitor, a buffer, and a liquid crystal capacitor, the pixels are electrically connected to a scan line, a display line, and a plurality of data lines, and the test method comprises:

disabling the buffer of each of the pixels;

driving the scan line and the display line to connect the liquid crystal capacitors and the precharged capacitors of the pixels to the data lines;

transmitting a first test voltage to odd data lines among the data lines, and transmitting a second test voltage to even data lines among the data lines, wherein the second test voltage is not equal to the first test voltage;

floating the odd data lines or the even data lines; and measuring the floated odd data lines or even data lines through a part of the testing pads to determine whether the liquid crystal capacitors of the pixels are electrically connected with each other.

7. The test method according to claim 6, wherein the step of measuring the floated odd data lines or even data lines through the part of the testing pads to determine whether the liquid crystal capacitors of the pixels are electrically connected with each other comprises:

electrically connecting the part of the testing pads to the odd data lines or the even data lines to obtain a plurality of measurement voltages;

comparing each of the measurement voltages with the first test voltage or the second test voltage to determine whether one of the measurement voltages or the second test voltage is equal to the first test voltage;

when one of the measurement voltages is not equal to the first test voltage or the second test voltage, determining that the liquid crystal capacitors of the pixels are electrically connected with each other; and when all of the measurement voltages are equal to the first test voltage or the second test voltage, determining that the liquid crystal capacitors of the pixels are not electrically connected with each other.

8. A test method of a liquid crystal display panel, wherein the liquid crystal display panel comprises M pixels and a testing pad, each of the pixels comprises a precharged capacitor, a buffer, and a liquid crystal capacitor, and the pixels are electrically connected to M scan lines, M display lines, and a data line, wherein M is an integer greater than or equal to 2, the test method comprising:

disabling the buffer of each of the pixels;

charging the liquid crystal capacitor and the precharged capacitor of the jth pixel to a first test voltage, wherein j is a positive integer smaller than M;

charging the liquid crystal capacitor and the precharged capacitor of the (j+1)th pixel to a second test voltage, wherein the first test voltage is not equal to the second test voltage;

while the $(j+1)^{th}$ scan line and the $(j+1)^{th}$ display line are driven, enabling the buffer of the $j^{th}$ pixel, and floating the data line; and while the $(j+1)^{th}$ scan line and the $(j+1)^{th}$ display line are driven, measuring the floated data line through the testing pad to determine whether the liquid crystal capacitors of the jth pixel and the $(j+1)^{th}$ pixel are electrically connected with each other.

9. The test method according to claim 8, wherein the step of charging the liquid crystal capacitor and the precharged capacitor of the $j^{th}$ pixel to the first test voltage comprises:

driving the $j^{th}$ scan line and the $j^{th}$ display line; and transmitting the first test voltage to the data line.

10. The test method according to claim 8, wherein the step of charging the liquid crystal capacitor and the precharged capacitor of the $(j+1)^{th}$ pixel to the second test voltage comprises:

driving the $(j+1)^{th}$ scan line and the $(j+1)^{th}$ display line; and transmitting the second test voltage to the data line.

11. The test method according to claim 8, wherein the step of measuring the floated data line through the testing pad to determine whether the liquid crystal capacitors of the $j^{th}$ pixel and the $(j+1)^{th}$ pixel are electrically connected with each other comprises:

electrically connecting the testing pad to the floated data line to obtain a measurement voltage;

comparing the measurement voltage with the second test voltage to determine whether the measurement voltage is equal to the second test voltage;

when the measurement voltage is not equal to the second test voltage, determining that the liquid crystal capacitors of the $j^{th}$ pixel and the $(j+1)^{th}$ pixel are electrically connected with each other; and when the measurement voltage is equal to the second test voltage, determining that the liquid crystal capacitors of the $j^{th}$ pixel and the $(j+1)^{th}$ pixel are not electrically connected with each other.

* * * * *